United States Patent [19]

Izu et al.

[11] Patent Number: 4,514,583
[45] Date of Patent: Apr. 30, 1985

[54] SUBSTRATE FOR PHOTOVOLTAIC DEVICES

[75] Inventors: Masatsugu Izu, Birmingham; Vincent D. Cannella, Detroit, both of Mich.

[73] Assignee: Energy Conversion Devices, Inc., Troy, Mich.

[21] Appl. No.: 549,055

[22] Filed: Nov. 7, 1983

[51] Int. Cl.[3] ............................................. H01L 31/04
[52] U.S. Cl. .................................. 136/259; 136/249; 136/256; 136/258
[58] Field of Search ............... 428/141, 430, 435, 458, 428/473.5, 481, 483; 136/244, 249, 256, 258 AM, 259

[56] References Cited

U.S. PATENT DOCUMENTS

| | | | |
|---|---|---|---|
| 3,450,562 | 6/1969 | Hoeschele et al. | 428/425.1 |
| 4,328,390 | 5/1982 | Meakin et al. | 136/259 |
| 4,334,120 | 6/1982 | Yamano et al. | 136/248 |
| 4,362,775 | 12/1982 | Yabe et al. | 428/213 |
| 4,376,228 | 3/1983 | Fan et al. | 136/255 |
| 4,377,723 | 3/1983 | Dalal | 136/249 |
| 4,380,566 | 4/1983 | Phy | 428/192 |
| 4,400,409 | 8/1983 | Izu et al. | 427/39 |
| 4,407,883 | 10/1983 | Newton | 428/215 |
| 4,419,530 | 12/1983 | Nath | 136/251 |
| 4,443,652 | 4/1984 | Izu et al. | 136/251 |

FOREIGN PATENT DOCUMENTS

| | | | |
|---|---|---|---|
| 0078541 | 5/1983 | European Pat. Off. | 136/258 AM |
| 3023165 | 1/1982 | Fed. Rep. of Germany | 136/259 |
| 56-152276 | 11/1981 | Japan | 136/258 AM |
| 57-49278 | 3/1982 | Japan | 136/259 |

OTHER PUBLICATIONS

"Plastic Film Insulates Solar Cells From Metal Substrate", *NASA Tech. Briefs*, Spring 1979, p. 143.
H. W. Deckman et al., "Fabrication of Optically Enhanced Thin Film a-SiH$_x$ Solar Cells", *J. Vac. Sci. Technol. A*, vol. 1, pp. 578-582, (1983).

*Primary Examiner*—Aaron Weisstuch
*Attorney, Agent, or Firm*—Marvin S. Siskind; Ronald W. Citkowski

[57] ABSTRACT

A composite substrate for the fabrication of thin film electronic devices. The substrate is a multi-layer structure which includes (1) a support layer having sufficient rigidity to provide structural strength for the subsequently deposited semiconductor material and/or circuit elements, and (2) an electrically insulating layer for providing electrical isolation in both the vertical and horizontal directions. In a preferred embodiment wherein the electronic device is formed as a solar cell, the insulating layer of the composite substrate may be provided with a texturized surface to form a diffuse, light reflecting surface. Also disclosed herein is a process for fabricating the multi-layer, back reflecting composite substrate of the instant invention.

1 Claim, 3 Drawing Figures

SUBSTRATE FOR PHOTOVOLTAIC DEVICES

FIELD OF THE INVENTION

This invention relates generally to electronic devices and more particularly to substrates for electronic devices which provide (1) structural support for subsequently deposited electrical or semiconductor layers, (2) electrical isolation from subsequently deposited electrical or semiconductor layers, and (3) a surface finish specifically adapted for the deposition of those layers thereonto. Also disclosed is a method for manufacturing the composite substrate of the instant invention, said composite substrate having particular utility for the fabrication of thin film electronic devices such as photovoltaic cells, thin film transistor arrays, thin film displays, thin film memory arrays and the like.

BACKGROUND OF THE INVENTION

In its broadest sense, this invention comprehends a composite substrate structure finding utility in the fabrication of electronic devices. The composite structure includes a support member which is a generally rigid (i.e. capable of operably supporting not only itself, but electrical and semiconductor layers deposited thereupon) sheet having a relatively thin electrically insulating coating deposited thereupon, the coating having chemical, mechanical, morphological and structural surface properties making it well-suited for the subsequent deposition of semiconductor layers thereonto.

Electronic devices are generally fabricated upon substrates which are adapted to provide (1) structural support to subsequently deposited regions of thin film metallic, electronic or semiconductor layers and (2) electrical isolation between adjacent regions of those metallic, electronic or semiconductor layers. Since the deposited metallic or semiconductor material is routinely less than a micron in thickness, the support afforded by the substrate is required to supply rigidity, thereby enabling the devices to be handled during fabrication, installation and repair. And because adjacent circuit elements and regions of the devices formed by the metallic, electronic, or semiconductor regions may be horizontally separated from one another by distances as small as a micron, good electrical isolation between those circuit elements and regions is necessary to prevent information contained in the circuit from being comingled and rendered meaningless. Further, in electronic devices employing a metallic substrate, an electrically insulating layer is necessary to vertically separate the metallic and semiconductor material from said metallic substrate, i.e., prevent short circuiting current through the common substrate. Therefore, electrical insulation and isolation must be provided in both the vertical and the horizontal directions in order to form the many types of operative electronic devices it is possible to manufacture utilizing the technology disclosed herein.

As used hereinafter, the term "electronic device" refers to a discrete device in the form of a single electronic component or circuit element which may either be used as is, or interconnected to other electronic components or circuit elements. A discrete device may comprise a single circuit element such as a transistor, diode, triode, photocell, etc.; or, may comprise an integrated circuit including therein a plurality of such circuit elements. The electronic device may be electrically interconnected to other devices to form interactive arrays such as photovoltaic arrays, memory arrays and the like. All semiconductor devices are specifically included in the definition of electronic devices used herein.

The selection and use of an appropriate substrate is especially important in the fabrication of thin film electronic devices. Such devices are typically fabricated by the sequential deposition of thin, patterned layers of semiconductor material and/or electrically conductive material in configurations chosen to provide a preselected flow of current between and through those layers. Such thin film devices have several advantages over monolithic single crystal devices insofar as they can (1) be economically fabricated, (2) cover large surface areas, and (3) also be deposited in a continuous production process. Since the films deposited on the substrates may be substantially less than one micron thick, they are incapable of self-support, and therefore must rely upon a substrate for rigidity. Furthermore, and as previously mentioned, in many instances the substrate must be electrically insulating in both the vertical direction to prevent shorting between the substrate and the superimposed metallic, electronic or semiconductor layers, and the horizontal direction to prevent shorting between adjacent electrically conductive circuits or circuit elements deposited upon the substrate.

Large area arrays of thin film electronic devices may be fabricated from a plurality of electrically isolated, discrete, circuit elements (diodes, triodes and transistors) which are deposited and interconnected upon the single large area substrate. In this manner large area logic arrays, memory storage devices, photovoltaic generators, display devices, etc. may be continuously and economically fabricated.

As previously described, when the electronic device includes a plurality of amorphous semiconductor layers, each individually deposited layer may be no more than a couple of hundred angstroms thick. As a result the layers, even when taken in toto are quite sensitive to defects and irregularities in the morphology of the substrate. More specifically, a crater descending onto the surface of the substrate or a projection arising from the surface of the substrate may not be fully covered or filled by the subsequently deposited thin layers of semiconductor material. If these morphological deviations from a smooth substrate surface are not fully covered by each layer of semiconductor material, current shunting paths are formed, thereby decreasing, if not totally destroying, the efficiency of the electronic device produced therefrom. Accordingly, the morphological quality of the substrate surface is an essential property of the substrate, the tolerances of which must be duly respected.

For reasons of economy, the large scale, continuous mass production of relatively large area, thin film electronic and semiconductor devices is of great commercial importance. The use of a thin, continuous, flexible substrate represents a means of economizing previous continuous processing techniques. While continuous processing would be possible utilizing non-flexible, non-continuous substrates, cost efficiency favors the continuous deposition of thin film electronic, metallic and semiconductor layers upon a continuous, flexible substrate in a roll-to-roll process. In this manner the production of amorphous electronic and semiconductor devices can complete with their crystalline counterparts in a cost effective manner.

Accordingly, it is one object of the instant invention to provide a thin, continuous, flexible substrate for electronic devices, said substrate (1) having sufficient rigidity to support the thin film layers of electronic, metallic and semiconductor material from which the device is fabricated during processing, handling, installation and repair thereof and (2) being electrically insulating in both the vertical and horizontal directions so as to provide electrical isolation both between the substrate and the superimposed layers of semiconductor material (vertical isolation), and between adjacent circuits and circuit elements formed upon the substrate (horizontal isolation). It is a further object of the instant invention to provide a thin, continuous substrate having sufficient flexibility to permit the continuous roll-to-roll fabrication of electronic devices thereupon. It is still another object of the instant invention to provide a thin, continuous, flexible substrate adapted to be used for the fabrication of electronic devices, the substrate having sufficient morphological smoothness and regularity to prevent current shunting defects from short circuiting electronic devices, produced thereon.

Previous substrate materials utilized for the production of electronic and semiconductor devices included rigid sheets of electronically insulating material, such as alumina, beryllia, glass, and quartz. While these substrate materials provided (1) good electrical isolation and mechanical support for electronic devices formed thereon, and (2) a morphologically smooth surface upon which to deposit semiconductor material, these substrates possess other inherent characteristics which render the fabrication of electronic and semiconductor devices therefrom cumbersome, if not impossible. For instance, glass and ceramic materials are relatively heavy, brittle and expensive. Further, processing steps involving such heavy, brittle substrates can become fairly complex due to problems associated with the handling and storage thereof. Additionally, electronic and semiconductor devices formed upon such substrates are relatively bulky and very heavy, thereby further reducing the weight and flexibility advantages which could otherwise be realized from the utilization of thin metallic and semiconductor films.

Plastic substrates are well known and have been utilized for sometime in the electronics industry for fabricating printed circuit boards and the like. However, plastic substrates have not heretofore been advantageously employed for the formation of thin film semiconductor layers directly thereupon. This is believed to be due to the facts that plastic substrates (1) do not provide sufficient morphological quality to deposit semiconductor layers without developing current shunting defects, (2) must be relatively thick in order to provide sufficient rigidity to accept stresses which build up in the deposited semiconductor layers, and (3) if fabricated of sufficient thickness and surface quality, would be too expensive to economically compete with other substrate materials.

Thin, metallic substrates offer several advantages over their plastic counterparts insofar as they (1) are rigid yet flexible, (2) may be made relatively thin without losing rigidity, (3) may be provided with a smooth surface finish, and (4) are relatively inexpensive. However, such thin metallic substrates neither provide (1) horizontal electrical isolation when fabricating electronic devices from contiguous circuits and circuit elements, nor (2) vertical electrical isolation when fabricating electronic devices from successive layers of metallic, electronic or semiconductor material deposited successively onto the substrate. Various layers of insulating material have previously been applied atop metallic substrates in the production of semiconductor and electronic devices, however, such insulating layers generally were formed of relatively thick coatings of ceramic materials. Accordingly, such insulated metallic substrates were not sufficiently flexible and/or did not present a sufficiently smooth surface for the deposition of thin film metallic circuitry or semiconductor layers thereonto.

Composite substrates, fabricated according to the principles of the instant invention, offer sufficient structural rigidity and good electrical isolation, whereby deposition of metallic and electronic circuitry and semiconductor material directly thereupon is possible. Furthermore, such composite substrates may be made sufficiently flexible so as to be employed in a roll-to-roll continuous process for the production of very large area electronic devices. Most importantly, composite substrates of the instant invention are characterized by a high quality surface finish which is optimized to substantially eliminate current shunting defects which would otherwise harm the efficiency of, if not totally destroy, thin film electronic devices produced by the deposition of the metallic, electronic or semiconductor material onto that surface.

There exists one additional capability which can be achieved through the use of the composite substrate of the present invention. In the manufacture of semiconductor devices such as photovoltaic cells, the efficiency of the devices may be increased by forming back reflectors on the surface of the substrate upon which the amorphous semiconductor materials are subsequently deposited. These back reflectors may be either specular or diffuse. With either type of reflector, light which has initially passed through the active region or regions of the devices, but which is unabsorbed or unused, is redirected from the back surface of the device by the reflector to pass, once again, through those active regions. The additional pass results in increased photon absorption and charge carrier generation in the active regions, thereby providing increased short circuit currents. In the case of specular back reflectors, the unused light is generally redirected for one additional pass through the active regions of the device. Contrarily, in the case of diffuse back reflectors, the light is scattered in addition to being redirected through the active regions, causing a portion of the redirected light to travel at angles sufficient to cause it to be substantially confined within the device by internal reflection, thereby producing multiple reflections of the redirected light through the active regions. As a result, both specular and diffuse back reflectors provide for increased short circuit currents and thus increased efficiencies. Another advantage of the diffuse reflector is that since the directed light passes through the active regions of the device at an angle, the active regions can be thinner to reduce charge carrier recombination, while still maintaining efficient charge carrier generation and collection.

Such specular and diffuse reflectors are described in detail in U.S. patent application Ser. No. 422,688 of Izu, et al, filed Sept. 24, 1982 now abandoned, and entitled "Apparatus and Method For Making Large Area Photovoltaic Devices Incorporating Back Reflectors; and U.S. patent application Ser. No. 359,371 of Cannella, et al, filed Mar. 18, 1982 and entitled "Improved Back Reflector System And Devices Utilizing Same". Both of the foregoing applications are assigned to the assignee of the instant invention and are incorporated herein by reference.

Unfortunately, problems existed with the methods employed, prior to the instant invention, to form either specular or diffuse back reflectors on the deposition surfaces of substrates. In the case of specular reflectors, it was difficult to deposit a mirror-like layer of a reflective material, such as gold, silver, aluminum, copper, chromium, or molybdenum, onto the substrate in a manner which would not subsequently peel. In the case of diffuse reflectors, a roughened texture was achieved by techniques such as sandblasting the substrate surface. However, such texturizing techniques resulted in the formation of morphological projections and craters of uncontrollable height and depth. As previously stressed, due to the very thin thickness of the deposited semiconductor layers, a projection extending upwardly from the surface of the substrate is likely not to be covered by the thin semiconductor layers. The result is a plurality of current shunting defects which render the photovoltaic device useless. Both the problems arising in the production of diffuse and specular back reflectors are solved by the use of the composite substrate disclosed in the present application. The morphologically smooth exterior of the insulating layer of the substrate provides a surface (1) upon which the metallic reflective material can be permanently applied for specular reflection, and (2) which can itself be controllably textured for diffuse reflection without simultaneously forming current shunting defects.

Recently, considerable efforts have been made to devleop systems for depositing amorphous semiconductor alloy materials, each of which can encompass relatively large areas, and which can be doped to form p-type and n-type materials for the production of p-i-n type semiconductor devices which are, in operation, substantially equivalent to their crystalline counterparts. It is to be noted that the term "amorphous", as used herein, includes all materials or alloys which have long range disorder, although they may have short or intermediate range order or even contain, at times, crystalline inclusions.

It is now possible to prepare amorphous silicon and germanium alloys by glow discharge deposition or vacuum deposition techniques, said alloys possessing (1) acceptable concentractions of localized states in the energy gaps thereof, and (2) high quality electronic properties. Such techniques are fully described in U.S. Pat. No. 4,226,898, entitled "Amorphous Semiconductors Equivalent To Crystalline Semiconductors", issued in the names of Stanford R. Ovshinsky and Arun Madan on Oct. 7, 1980; U.S. Pat. No. 4,217,374, issued in the names of Stanford R. Ovshinsky and Mastasugu Izu on Aug. 12, 1980, also entitled "Amorphous Semiconductor Equivalent To Crystalline Semiconductors"; and U.S. patent application Ser. No. 423,424 of Stanford R. Ovshinsky, David D. Allred, Lee Walter, and Stephen J. Hudgens entitled "Method of Making Amorphous Semiconductor Alloys And Devices Using Microwave Energy". As disclosed in these patents and application, fluorine introduced into the amorphous silicon semiconductor layers operates to substantially reduce the density of the localized states therein and facilitates the addition of other alloying materials, such as germanium.

The concept of utilizing multiple cells, to enhance photovoltaic device efficiency, was described at least as early as 1955 by E. D. Jackson in U.S. Pat. No. 2,949,498, issued Aug. 16, 1960. The multiple cell structures therein discussed utilized p-n junction crystalline semiconductor devices. Essentially the concept employed different band gap devices to more efficiently collect various portions of the solar spectrum and to increase open circuit voltage (VOC). The tandem cell device (by definition) has two or more cells with the light directed serially through each cell. In the first cell a large band gap material absorbs the short wavelength light, while in subsequent cells smaller band gap materials absorb the longer wavelengths of light which pass through the first cell. By substantially matching the currents generated in each cell, the overall open circuit voltage becomes the sum of the open circuit voltage generated in each cell, while the short circuit current thereof remains substantially constant.

Unlike crystalline materials which are limited to batch processing for the manufacture of solar cells, amorphous semiconductor alloys can be deposited in multiple layers over large area substrates to form semiconductor devices in a high volume, continuous processing system. Such continuous processing systems are disclosed in pending patent applications and patents: Ser. No. 151,301, filed May 19, 1980, for "A Method Of Making P-Doped Silicon Films And Devices Made Therefrom" now U.S. Pat. No. 4,400,409; Ser. No. 244,386, filed Mar. 16, 1981, for "Continuous Systems For Depositing Amorphous Semiconductor Material"; Ser. No. 240,493, filed Mar. 16, 1981, for "Continuous Amorphous Solar Cell Production System" now U.S. Pat. No. 4,410,588; Ser. No. 306,146, filed Sept. 28, 1981, for "Multiple Chamber Deposition And Isolation System And Method" now U.S. Pat. No. 4,438,723; Ser. No. 359,825, filed Mar. 19, 1982 for "Method And Apparatus For Continuously Producing Tandem Amorphous Photovoltaic Cells" now U.S. Pat. No. 4,492,181; and Ser. No. 460,629 filed Jan. 24, 1983 for "Method And Apparatus For Continously Producing Tandem Amorphous Photovoltaic Cells" now U.S. Pat. No. 4,485,125. As disclosed in these patents and applications, a substrate may be continously advanced through a succession of deposition chambers, wherein each chamber is dedicated to the deposition of a specific semiconductor material. In making a photovoltaic device of p-i-n type configuration, the first chamber is dedicated for depositing a p-type semiconductor alloy, the second chamber is dedicated for depositing an intrinsic amorphous semiconductor alloy, and the third chamber is dedicated for depositing an n-type semiconductor alloy.

The layers of semiconductor material thus deposited in the vacuum envelope of the deposition apparatus may be utilized to form a photovoltaic device including one or more p-i-n cells, one or more n-i-p cells, a Schottky barrier, photodiodes, phototransistors, or the like. Additionally, by making multiple passes through the succession of deposition chambers, or by providing an additional array of deposition chambers, multiple stacked cells of various configurations may be obtained.

In addition to being utilized for the fabrication of photovoltaic devices and similar large area photovoltaic arrays, the foregoing techniques of depositing thin film amorphous semiconductor materials can be utilized to form electronic devices utilizing or incorporating one or more triodes, transistors, diodes and combinations thereof. In this manner large area (one foot square or greater) electronic devices such as memory devices, signal processing devices, display devices and the like may be prepared. The instant invention therefore provides a composite substrate layer having great utility in devices of this type.

These and other advantages of the instant invention will become apparent from the drawings, the detailed description of the invention and the claims which follow.

BRIEF SUMMARY OF THE INVENTION

There is disclosed herein a composite substrate which provides (1) structural support and (2) vertical as well as horizontal electrical isolation for electrical circuitry fabricated thereon. The composite substrate comprises a relatively thick support layer which includes at least one substantially planar surface, and a relatively thin, flexible, electrically insulating layer deposited atop the planar surface of the support layer. The support layer is adapted to provide structural support for the electrical circuitry, while the insulating layer is adapted to electrically isolate the electrical circuitry from the support layer in the vertical direction and from adjacent electrical circuitry in the horizontal direction. In one preferred embodiment of the invention, the support layer consists of a flexible metallic member such as stainless steel, and the insulating layer is fashioned of a thin film organic polymer such as a polyimide. The composite substrate is especially well adapted for use as the foundation of thin film micro-electronic devices such as photovoltaic devices, thin film transistors and memory arrays.

The composite substrate may be provided with a textured, or reticulated exterior insulating layer surface, said reticulated surface, when covered with a conformal coating of reflective material such as gold, silver, aluminum, copper, etc., provides a diffuse back reflector. Such a diffuse, light-reflective surface is advantageously employed in photovoltaic devices to increase current generation and hence the efficiency of those devices.

Finally, there is also disclosed herein a method of fabricating the composite substrate by disposing, in the preferred embodiment a layer of organic polymer material onto the planar surface of the support layer, and (2) embossing or otherwise texturizing the surface of the deposited organic polymer material.

DETAILED DESCRIPTION OF THE DRAWINGS

I. The Photovoltaic Cell

Figure 1:
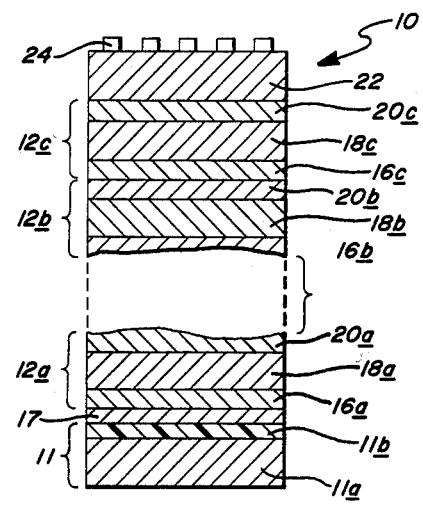
FIG. 1 is a fragmentary cross-sectional view of a thin film tandem photovoltaic device comprising a plurality of p-i-n type cells stacked atop the composite substrate of the instant invention.

Referring now to the drawings and particularly to FIG. 1, a photovoltaic cell, formed of a plurality of successive p-i-n layers, each of which includes, in the preferred embodiment, an amorphous semiconductor alloy, is shown generally by the numeral 10. The composite substrate of the instant invention was developed for the fabrication of thin film electronic devices such as the photovoltaic device shown in FIG. 1, and is especially well adapted for use in a continuous deposition process wherein semiconductor layers are continuously deposited onto a substrate in successive isolated deposition chambers.

More particularly, FIG. 1 shows a p-i-n type photovoltaic device such as a solar cell made up of individual p-i-n type cells 12a, 12b and 12c. Below the lowermost cell 12a is the composite substrate 11 of the present invention, said substrate 11 consisting of a relatively thick support layer 11a and a flexible, relatively thin insulating layer 11b, both of which will be described in greater detail hereinbelow.

An electrically conductive bottom, electrical contact layer 17 is operatively disposed atop the insulating layer 11b so as to be in electrical communication with the semiconductor cells 12a, 12b, 12c formed thereatop. It is to be noted at this point that, in some cases, it is desirable to include a specular or diffuse back reflector layer (a diffuse back reflector is shown by the reference numeral 11d in FIG. 3) as part of the substrate 11 of the photovoltaic cell 10. This back reflector layer 11d, if specular, may be the bottom contact 17, or, if diffuse, is disposed immediately beneath the bottom contact 17, so that it functions to scatter and redirect light passing through the active regions of the photovoltaic cell. As will be discussed in greater detail hereinafter, the electrically insulating layer 11b of the substrate 11 of the instant invention may be provided with a roughened, or textured, or reticulated, or patterned surface to form that diffuse surface of the back reflector.

Each of the cells 12a, 12b, and 12c are fabricated with an amorphous semiconductor body containing at least a silicon or germanium alloy. Each of the semiconductor bodies includes an n-type conductivity layer 20a, 20b and 20c; an intrinsic layer 18a, 18b and 18c; and a p-type conductivity layer 16a, 16b and 16c. As illustrated, cell 12b is an intermediate cell and, as indicated in FIG. 1, additional intermediate cells may be stacked atop cells without departing from the spirit or scope of the present invention. Also, although p-i-n cells are illustrated, the composite substrate of this invention may also be used in deposition apparatus adapted to produce any type of thin film electronic device in either a continuous or batch mode of production.

It is to be understood that following the deposition of the semiconductor layers, a further deposition process may be either performed in a separate environment or as part of a continuous process. In this step, TCO (transparent conductive oxide) layer 22 is added. This layer functions as the upper electrode, and cooperates with the bottom contact layer 17 to establish a current path through the device 10. An electrode grid 24 may be added to the device where the cell is of a sufficiently large area, or if the conductivity of the TCO layer 22 is insufficient. The grid 24 shortens the carrier path through the TCO and thus increases the conduction efficiency.

II. The Multiple Glow Discharge Deposition Chamber

Figure 2:
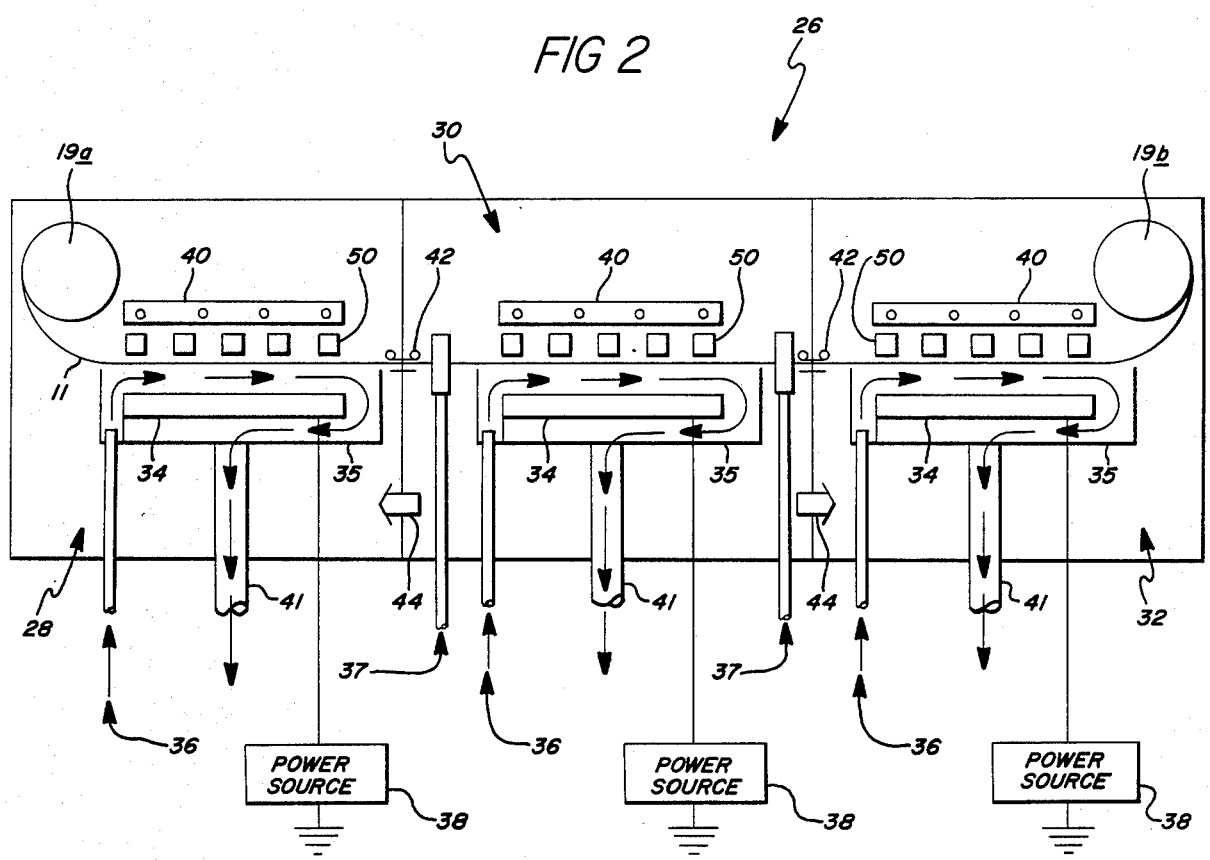
FIG. 2 is a diagammatic representation of a multiple glow discharge chamber deposition system adapted for the continuous production of photovoltaic devices of the type shown in FIG. 1, by depositing semiconductor material upon the composite substrate of the instant invention.

Turning now to FIG. 2, a diagrammatic representation of a multiple glow discharge chamber deposition apparatus for the continuous production of photovoltaic cells is generally illustrated by the reference numeral 26. The apparatus 26 includes a plurality of isolated, dedicated deposition chambers, each chamber of which is interconnected by a gas gate through which sweep gases and a web of substrate material 11 are adapted to pass.

The apparatus 26 is adapted to mass produce, in the preferred embodiment, large area, amorphous semiconductor cells having a p-i-n type configuration on the surface of a substrate material 11 which is continually fed therethrough. To deposit the amorphous semiconductor layers required for producing multiple p-i-n type layer cells, the apparatus 26 includes at least one triad of deposition chambers. Each triad of deposition chambers comprises: a first deposition chamber 28 in which a p-type conductivity semiconductor layer is deposited onto the deposition surface of the substrate 11 as the substrate 11 passes therethrough; a second deposition chamber 30 in which an intrinsic amorphous semiconductor layer is deposited atop the p-type alloy layer on the deposition surface of the substrate 11 as the substrate 11 passes therethrough; and a third deposition chamber 32 in which an n-type conductivity semiconductor layer is deposited atop the intrinsic layer on the deposition surface of the substrate 11 as the substrate 11 passes therethrough. It should be apparent that, (1) although only one triad of the deposition chambers has been illustrated, additional triads or additional individual chambers may be added to the apparatus to provide the machine with the capability of producing semiconductor cells having any number of p-i-n type semiconductor layers; (2) the composite substrate of the present invention may be utilized with any type of deposition apparatus adapted to deposit semiconductor material for use in the fabrication of electronic devices; (3) the substrate supply core 19a and the substrate take-up core 19b are shown as disposed in the deposition chambers for illustrative purposes only, while in reality the cores would be housed in separate chambers operatively connected to the deposition chambers; and (4) although the glow discharge technique illustrated herein employs cathodes energized by r.f. power, other glow discharge techniques such as the use of microwave frequencies, may be employed without departing from the spirit of the present invention.

Each deposition chamber 28, 30 and 32 of the triad is adapted to deposit a single semiconductor layer, by glow discharge deposition into the substrate 11. To that end, each of the deposition chambers 28, 30 and 32 includes: a cathode 34; a shield 35 disposed about each of the cathodes 34; a process gas supply conduit 36 for introducing process gas mixtures into the area adjacent the cathodes; a power source 38 such as an alternating current generator; an evacuation conduit 41 for removing unused or spent process gases and nondeposited plasma components; a plurality of transversely extending magnetic elements 50; a plurality of radiant heating elements shown schematically as 40; and a gas gate 42 operatively connecting the intrinsic deposition chamber to each of the dopant chambers. Further, inert sweep gas conduits 37 are disposed on opposed sides of the intrinsic deposition chamber 30 for establishing a unidirectional flow of inert gas through the gas gates 42. Although the gas gates 52 are depicted as establishing a unidirectional flow of inert gas, the gas gates 52 may also have other types of internal flow of sweep gas established as long as the flow operates to prevent diffusion of process gas between the adjacent deposition chambers.

The supply conduits 36 are operativly associated with the respective cathodes 34 to deliver process gas mixtures to the plasma regions which are created in each deposition chamber between said cathodes 34 and the substrate 11. The cathode shields 35 are adapted to operate in conjunction with the web of substrate material 11 and the evacuation conduit 41 to substantially confine the plasma within the cathode region of the deposition chambers.

The alternating current generators 38 operate in conjunction with the cathodes 34, the radiant heaters 40 and the grounded substrate 11 to form the plasma, and disassociate the process gases entering the plasma region of the deposition chambers into deposition species. The deposition species are then deposited onto the bottom surface of the substrate 11 as amorphous semiconductor layers. The substrate 11 may be maintained substantially flat by the plurality of rows of magnetic elements 50 which provide an attractive force urging the substrate upwardly, out of its normal sagging path of travel.

To form the photovoltaic cell 10 representing the preferred embodiment illustrated in FIG. 1, a p-type semiconductor layer is deposited onto the substrate 11 in the deposition chamber 28, an intrinsic amorphous semiconductor layer is deposited atop the p-type layer in the deposition chamber 30, and an n-type semiconductor layer is deposited atop the intrinsic layer in the deposition chamber 32. As a result, the apparatus 26 deposits at least three successive semiconductor layers onto the substrate 11, wherein the intrinsic layer deposited in deposition chamber 30 differs in composition from the layers deposited in deposition chambers 28 and 32 by the absence of at least one element which will be referred to as the dopant or doping species.

The composite substrate 11 forms the base or foundation upon which the layers of semiconductor material making up the photovoltaic device 10 are subsequently deposited. Accordingly, the composite substrate must be of an acceptable morphological quality if the electronic device 10 is to perform in an optimum manner. While the foregoing description dealt with the deposition of semiconductor layers for the fabrication of a photovoltaic cell, the composite substrate 11, described herein, is equally well-suited for providing support and electrical isolation for the fabrication of other electronic devices through the deposition thereonto of other electronic circuit elements as, for example, by a metallization step.

III. The Composite Substrate

The composite substrate 11 of the instant invention, as illustrated in conjunction with the photovoltaic device shown in FIG. 1, is a bi-layer structure, having a first, relatively rigid, relatively thick (as compared to the electrically insulating layer, the metallizing layer, the circuit layers, or layers of semiconductor material) support layer 11a upon which an electrically insulating layer 11b is deposited. It is the insulating layer 11b which is adapted to contact (1) the circuit elements, or (2) the active semiconductor layers, or (3) the electrode layers which are subsequently deposited thereatop. It is to be noted that the term "relatively rigid" as applied to the support layer 11a is meant to define a material having sufficient structural strength to resist deformation, and which is, therefore capable of providing structural stability and support to the thin film semiconductor material subsequently deposited thereonto. The term "relatively rigid" as used herein is intended to include materials having a degree of flexibility such as, for example thin (5–10 mils) sheets of stainless steel, as well as, inflexible materials, such as thicker sheets of metal, or ceramics. Disposed atop and generally coextensive with the support layer 11a is the relatively thin layer of electrically insulating material 11b which is adapted to provide (1) electrical isolation in both the horizontal and vertical directions, and (2) a suitable surface (in terms of adhesion properties and morphological smoothness) to aid in the subsequent deposition of semiconductor material thereonto.

Owing to the fact that the insulating layer 11b will effectively electrically isolate the support layer 11a from subsequently deposited metallized layers or layers of semiconductor material, the support layer 11a may be fabricated from a wide variety of heretofore unusable materials. Some of the materials from which the support layer 11a may be fabricated include, inter alia, (1) metals such as steel, stainless steel, aluminum, brass, etc., as well as (2) non-metallic materials such as glass, ceramics, plastics, cardboard, wood, and hardboard. It is a notable feature of the instant invention that relatively low cost substrate materials such as cardboard may be employed to fabricate the substrate for the range of electronic devices discussed herein, in preference to the relatively expensive ceramic materials to which the electronic industry was heretofore limited. In selecting a substrate support material, the most important characteristics are rigidity and thickness. The support layer 11a must be of a thickness sufficient to ensure rigidity of the electronic circuits and circuit elements deposited thereupon; and accordingly, the minimum thickness of the layer 11a is dependent upon the material from which it is made. For example, in order to ensure sufficient flexibility and durability in a continuous roll-to-roll process, a stainless steel support layer 11a 3–8 mils thick was found to be satisfactory. Obviously the upper limit (the maximum thickness) must take into account parameters such as weight, cost, flexibility, rigidity, and dimensional stability.

The electrically insulating layer 11b is preferably formed of a material having a high dielectric strength, good adhesion to the support layer 11a, a smooth surface finish, and possessing the capability of being coated by a relatively thin continuous electronic layer of uniform surface quality. Organic polymers such as polyesters and polymides are one group of materials, the properties of which are especially well suited for this purpose. For example, the insulating layer 11b may be formed of (1) polyethyleneterepthalate, or (2) polyimides such as KAPTON (registered trademark of a polyimide manufactured by the Dupont Chemical Company), Polyimide XU 218, or Polyimide XU 218HP manufactured by the CIBA-Geigy Corporation. All of these materials exhibit excellent electrical insulation properties, ease of application, and form morphologically acceptable, i.e., tough, pin-hole-free and defect-free, coatings. Thickness of the insulating coating will depend upon the electronic device to be manufactured thereupon, however, coatings of 0.5–5 microns are well within accepted tolerances. Thinner coatings may not exhibit sufficiently high dielectric strength, or may include pin holes which could produce short circuit current paths upon operation of the electronic devices fabricated therefrom. Thicker coatings could result in problems of adhesion of the subsequently deposited electronic layers and loss of flexibility, and would additionally be costly to produce. However, in some cases it may be desirable to have the insulating coating 11b be a substantially thicker layer, as for example, when the insulating layer 11b is to be texturized. This will be detailed hereinafter.

Preparation of the composite substrate 11 is best effected by a solvent coating process. In such a process the material which will form the insulating layer 11b is dissolved in an appropriate solvent, coated onto the substrate support layer 11a, and then dried to remove the solvent. Depending upon the material being coated, an additional curing step may be required to cross link and harden the substrate insulating layer 11b.

Figure 3:
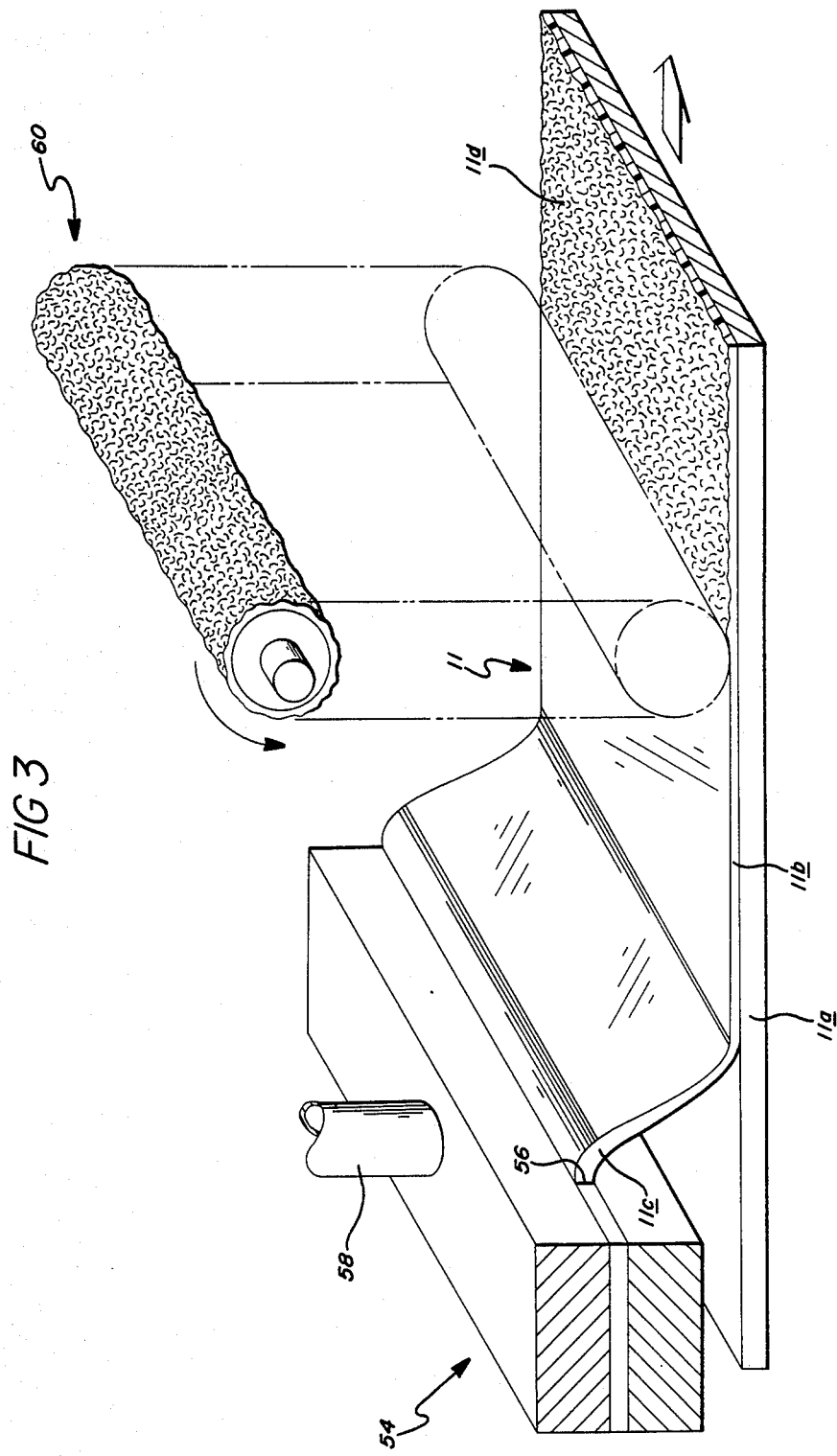
FIG. 3 is an enlarged perspective view, partially in cross-section, illustrating one type of extrusion coating apparatus operatively disposed for applying an insulating layer onto a support member so as to form a composite substrate; depicted in phantom outline is a textured roller oeratively disposed to emboss a textured pattern upon the extruded insulating layer.

Referring now to FIG. 3, an extrusion coating head 54 is shown operatively disposed adjacent the support member 11a so as to deposit an insulating material solution thereonto, thereby producing the composite substrate 11 of the instant invention. The coating head 54 includes an elongated opening or gap 56 formed therein through which the insulating material solution is fed from an insulating material solution supply conduit 58 onto the support layer 11a of the substrate 11. In operation, a solution of the insulating material which will form the insulating substrate layer 11b is fed, under pressure, from the supply conduit 58 through the coating head gap 56. The pressure causes a thin film 11c of the solution of insulating material to be extruded from the gap 56 and deposited onto the moving web of substrate material 11a due to the interactive effects of surface tension and gravity. Once deposited onto the substrate support layer 11a, the solution dries to form the substrate insulating layer 11b. The drying process may be hastened by the use of drying ovens or other heating techniques such as the use of radiant heat, conductive heat or forced air. Drying times and conditions will depend upon the insulating material and the solvent employed. The thickness of the insulating substrate layer is controlled by selecting the dimension of the gap 56 in the coating head 54, the pressure applied to the solution in the supply conduit 58 and the travel speed of the web of substrate support material 11a, in accordance with extrusion technology which is well known to those skilled in the art.

If desired, the deposition surface of the insulating layer 11b may be textured as by embossing a pattern thereonto. One such method of embossing a textured pattern onto the insulating layer 11b is through the use of a textured roller 60, shown in phantom outline in FIG. 3. Obviously, the textured pattern 11d could be impressed upon the insulating layer 11b by other well known means. For example, a texturized surface 11d may be provided by forming a reticulated pattern, referred to as an "orange peel" surface by those in the coating art, onto the surface of the insulating layer 11b. This orange peel surface may be obtained by utilizing a dual solvent technique for depositing the insulating polymer. The dual solvent technique comrpises admixing a low boiling and high boiling solvent with the insulating polymer. The low boiling solvent evaporates relatively quickly when heated and thus provides a skin of polymeric material atop the undried polymeric solution. This skin wrinkles, or puckers as the higher boiling solvent evaporates during continued heating. By careful selection of the solvents and control of the solvent drying parameters, an insulating material having a reticulated pattern of appropriated morphology may be formed. It is also possible to produce such an orange peel surface from a single solvent system by proper manipulation of drying conditions, as is well known to those skilled in the art. Note that Applicants are not claiming to have invented the texturing techniques described herein, but claims that the use thereof for the manufacture of electronic devices represents a novel and important breakthrough in the electronic industry.

Incorporation of solid particulate into or onto the substrate insulating layer 11b can also provide the desired textured pattern to that layer. For example, solid particulate such as colloidal silica, Teflon particles, alumina particles or the like, may be suspended in the polymer solution from which the insulating layer is formed, and coated therewith onto the surface of the substrate support layer 11a. Upon drying, an insulating layer with a surface texture resulting from the particulate inclusions will thus be formed. Obviously the particles must be of a size, composition and shape which will not interfere with subsequent device fabrication steps. The particles utilized must be of an appropriate size and shape to provide for optimized diffuse reflection, i.e., the particles should produce morphological craters and projections on the order of ¼ to 1 micron in depth below or height above a reference plane on the surface of the insulating layer 11b. Furthermore, the particles must be formed from an electrically insulating material to avoid short circuiting current from the subsequently deposited electrical layers to the substrate support member 11a. Additionally, the particulate material should have a particle morphology that is devoid of highly irregular shapes such as jagged spikes and sharp edges so as to avoid the introduction of defect regions which cannot be uniformly covered by subsequently deposited thin films of electronic, metallic or semiconductor material. Materials such as the aforementioned silica, alumina and Teflon particulate are (1) readily available in a wide range of particle sizes, ranging from submicron to several micron diameters, (2) good electrical insulators, and (3) available as gently rounded grains of substantially uniform size. Accordingly, such materials are well suited for fabrication of the substrate insulating layer 11b of the instant invention.

Rather than applying the particles atop the substrate insulating layer 11b in a single step procedure wherein said particles are suspended in a solution of polymeric material, it may be desirable, in some cases, to deposit the particles atop the previously deposited insulating layer 11b. Such a coating procedure would assure that the particles are present primarily in the uppermost or external (i.e., distal from the support member) region of the substrate insulating layer 11b. In such case, a suspension of the particulate matter in an appropriate solvent is deposited onto the uppermost surface of the substrate insulating layer 11b and subsequently dried. The choice of solvent will depend upon the nature of the substrate insulating layer and the solid particulate utilized. The solvent should be selected so as to somewhat soften the insulating material so that the solid particulates will embed themselves thereinto. However, the solvent must be selected so as not to (1) completely dissolve the insulating material (2) dissolve or react with the solid particulate; but rather, should maintain said solid particulate in suspension until such time that it is deposited onto the uppermost surface of the insulating layer 11b.

The following examples are illustrative of methods of preparing a composite substrate 11, said methods in keeping with the principles of the instant invention.

EXAMPLE I

Utilizing the extrusion coating apparatus depicted in FIG. 3, a composite substrate for electronic devices was prepared as follows: A 10 percent solution of Polyimide XU-218 HP, supplied by the CIBA-Geigy Corporation, was made by dissolving 20 grams of the polyimide in 180 grams of a solvent mixture comprising 50% acetopheone and 50% xylene. The solution was stirred to effect complete solution, and filtered to remove suspended impurities. The solution was then deposited onto a substrate support layer of 5 mil stainless steel utilizing an extrusion coating head having a gap setting of 8 mils, and a web speed of 5 feet/minute. The solvent was removed by passing the stainless steel support layer with the solution deposited thereupon through a drying tunnel lined with infrared heating lamps which maintained the substrate at a temperature of approximately 100° C. for approximately 10 minutes. The result was the deposition of a layer of insulating material, approximately 2 microns thick, upon the stainless steel support layer, whereby a composite substrate exhibiting excellent surface quality and specifically adapted for the deposition of semiconductor and metallic layers thereupon was prepared. Although no further heating step was utilized in the fabrication of the insulating layer pursuant to the foregoing steps, it is sometimes advantageous to include a high temperature (approximately 350° C. for 30 mintutes) post-coating cure step for initiating cross-linking to improve the hardness, solvent resistance and dimensional stability of the polyimides. Furthermore, post-deposition heating serves to volatize residual solvent in the deposited film, thereby preventing outgassing when the substrate is utilized in a vacuum deposition process.

EXAMPLE II

A composite substrate having a reticulated orange peel surface was prepared as follows: A 10 percent solution of the aforementioned Polyimide XU-218HP, was made by dissolving 20 grams of the polyimide in 180 grams of solvent mixture comprising 50% gamma butyrolactone and 50% methyl ethyl ketone by weight. The solution was filtered and deposited onto a 5 mil stainless steel supporting substrate by an extrusion process similar to that described hereinabove with reference to Example I. Following the deposition step, the insulating layer was dried for 2-3 minutes in an infrared drying tunnel maintained at 90°-100° C. The resulting insulating layer of the composite substrate exhibited a textured outermost surface with reticulations of approximately 0.5 micron in height above the surface or depth below the surface. The total thickness of the deposited insulating layer was approximately 1.5 micron.

EXAMPLE III

In this example, a textured insulating layer was provided atop a stainless steel support layer as follows: A 10 percent solution of Polyimide XU-218HP in acetophenone/xylene (50:50) was prepared as in Example I. Two grams of colloidal silica, having a nominal particle size of 1 micron was added to the polyimide solution, and stirred for 30 minutes to completely suspend the silica particles. The solution was then extruded onto the surface of a 5 mil thick stainless steel support layer and dried as in Example I. This procedure resulted in the formation of a one micron thick, textured, insulating layer having patterned features extending approximately 0.25 to 0.5 microns above and 0.25 to 0.5 microns below a reference plane established thereacross.

EXAMPLE IV

A textured surface was formed in the insulating layer of the composite substrate produced in Example I as follows: A suspension of silica particles was made by stirring 10 grams of 0.5 micron colloidal silica particles into 90 grams of methylene chloride. The resulting suspension was extruded onto the polymide coated stainless steel support layer from a coating head having a gap setting of 2 microns. The web speed was 5 feet/minute, and the deposited layer was dried in a heating tunnel which maintained the substrate at a temperature of 30° C. for approximately 5 minutes. This procedure resulted in the formation of a textured pattern upon the polyimide, said pattern including features extending approximately 0.25 to 0.5 microns above and 0.25 to 0.5 microns below a reference plane established across the surface of said insulating layer.

Obviously, any of the many other deposition techniques well known to those skilled in the art may be utilized to apply textured insulating layers to the support substrate. For example, spin coating, wherein centrifugal force distributes the polymeric solution across a spinning substrate, may be utilized; as may techniques such as dip-coating, drawbar coating, spray coating, etc. Furthermore, the insulating layer may be applied by (1) melting the polymeric material with or without solid particulate therein, onto the support substrate or (2) laminating sheets of the polymeric material onto the support substrate.

All of the substrates prepared in the foregoing examples exhibited surface morphology that made them suitable for the prepartion of thin film electronic devices thereupon. That is to say (1) the layer of insulating material was substantially planar, (2) lacked substantial numbers of gross defects such as (a) pin holes or voids which could short circuit current from the thin film layers of the electronic device deposited thereupon, or (b) jagged spikes or protruberances which could project through subsequently deposited thin film layers so as to cause device failure, and (3) exhibited good adherance characteristics. Furthermore, the texturized surface of the insulating layers were found to provide good diffuse reflectors, especially if metallized with one of the conformal, highly reflective materials enumerated hereinabove.

The foregoing descriptions, drawings and example are merely illustrative of the principles of the instant invention, and are not intended to be limitations thereon. It is the following claims, including all equivalents, which are intended to define the scope of the invention.

What is claimed is:

1. In a photovoltaic device of the type comprising: a first electrode; an active semiconductor body electrically communicating with the first electrode, said semiconductor body adapted to generate a flow of electrical current in response to light energy incident thereupon; and a second electrode electrically communicating with the semiconductor body; the improvement comprising:

a composite substrate for said device including (1) a relatively thick support layer having at least one substantially planar surface, and (2) a relatively thin, flexible, substantially defect free, electrically insulating layer formed of a synthetic polymeric material disposed atop the planar surface of the support layer, said electrically insulating layer characterized by a textured surface, the textured surface formed by features sized and shaped so as to substantially enhance the absorption of light by the semiconductor body;

a light reflective body conformally disposed atop the textured surface of the insulating layer, said light reflective body forming the first electrode;

whereby said support layer provides (1) structural support for the electrodes and the semiconductor body of the photovoltaic device, and (2) vertical electrical insulation between the substrate and the first electrode of said photovoltaic device.

* * * * *